United States Patent [19]

Mori et al.

[11] 4,315,205

[45] Feb. 9, 1982

[54] GENERATION CONTROL APPARATUS FOR VEHICLE GENERATORS

[75] Inventors: Kazumasa Mori, Aichi; Taro Asahi, Chiryu; Keiichiro Banzai, Toyota; Katsutaro Iwaki, Chiryu; Katsuya Muto, Kariya; Akira Mase, Handa; Takayasu Nimura, Nagoya; Katsumi Itoh, Ohbu; Yoshio Akita, Ichinomiya, all of Japan

[73] Assignee: Nippondenso Co., Ltd., Kariya, Japan

[21] Appl. No.: 152,823

[22] Filed: May 23, 1980

[30] Foreign Application Priority Data

Aug. 3, 1979 [JP] Japan .................................. 54-6597
Aug. 3, 1979 [JP] Japan .................................. 54-99560
Sep. 7, 1979 [JP] Japan .................................. 54-115473

[51] Int. Cl.³ .............................................. H02J 7/14
[52] U.S. Cl. ...................................... 322/99; 322/28; 320/48

[58] Field of Search ............... 320/48, 64, 68; 322/28, 322/37, 99

[56] References Cited

U.S. PATENT DOCUMENTS

4,247,813 1/1981 Gansert et al. ...................... 322/99

Primary Examiner—J. D. Miller
Assistant Examiner—John W. Redman
Attorney, Agent, or Firm—Cushman, Darby & Cushman

[57] ABSTRACT

A generation control apparatus for vehicle generator normally controls the energization of the vehicle generator in response to a terminal voltage of a battery which is charged by the generator through a rectifier. The generation control apparatus includes a fault detection circuit to detect an abnormal condition of the terminal voltage of the battery or the output voltage of the generator, and if the abnormal condition is detected, a changeover circuit effects the control of the energization in accordance with the output voltage of the generator instead of the battery terminal voltage.

7 Claims, 7 Drawing Figures

GENERATION CONTROL APPARATUS FOR VEHICLE GENERATORS

The present invention relates to generation control apparatus for vehicle generators and more particularly to a generation control apparatus which is capable of satisfactorily controlling the output voltage of a generator even when its output terminal is open.

Known apparatus of the above type are usually of the double sensing type in which the terminal voltage of a battery and the output voltage of a generator are applied to a common voltage detecting circuit (voltage dividing circuit) through a resistor and a diode. Thus, there is a disadvantage that a voltage difference is caused between the battery voltage and the generator output voltage by the line drop of the charging line or the like and the two voltages affect each other, making it difficult to properly adjust the voltage detecting point.

With a view to overcoming the foregoing deficiencies in the prior art, it is the object of the present invention to provide a generation control apparatus for vehicle generators wherein in the normal condition the terminal voltage of a battery is preferentially detected to control the power generation in accordance with the detected battery terminal voltage, whereas when a fault condition such as a break in the charging line from the generator to the battery occurs, utilizing the fact that the generator instantaneously generates a high voltage in response to such a fault condition, switching between detection modes is effected in such a manner that the generator terminal voltage is detected in place of the battery terminal voltage so as to control the generation of power, thus making it possible to set the battery terminal voltage and the generator terminal voltage entirely independently of each other and practically without any need to take the voltage drop across the charging line into consideration.

In accordance with a preferred embodiment of the invention, the control apparatus is so designed that a switching signal for switching the voltage detection part from the battery terminal voltage to the generator terminal voltage is utilized so as to turn on a generation indicator lamp in accordance with the switching signal, whereby when the terminal voltage of the generator is controlled the driver is informed of this fact by means of the generation indicator lamp and that the detection point of the generator output voltage is set slightly high whereby when the battery voltage detecting terminal is disconnected, the adjustment is effected by means of a slightly high voltage and the driver is warned against the resulting overcharging of the battery so as to prevent it.

The above and other objects of the invention will be made more apparent from the following description taken in conjunction with the accompanying drawings wherein like reference numerals refer to like parts.

Figure 1:
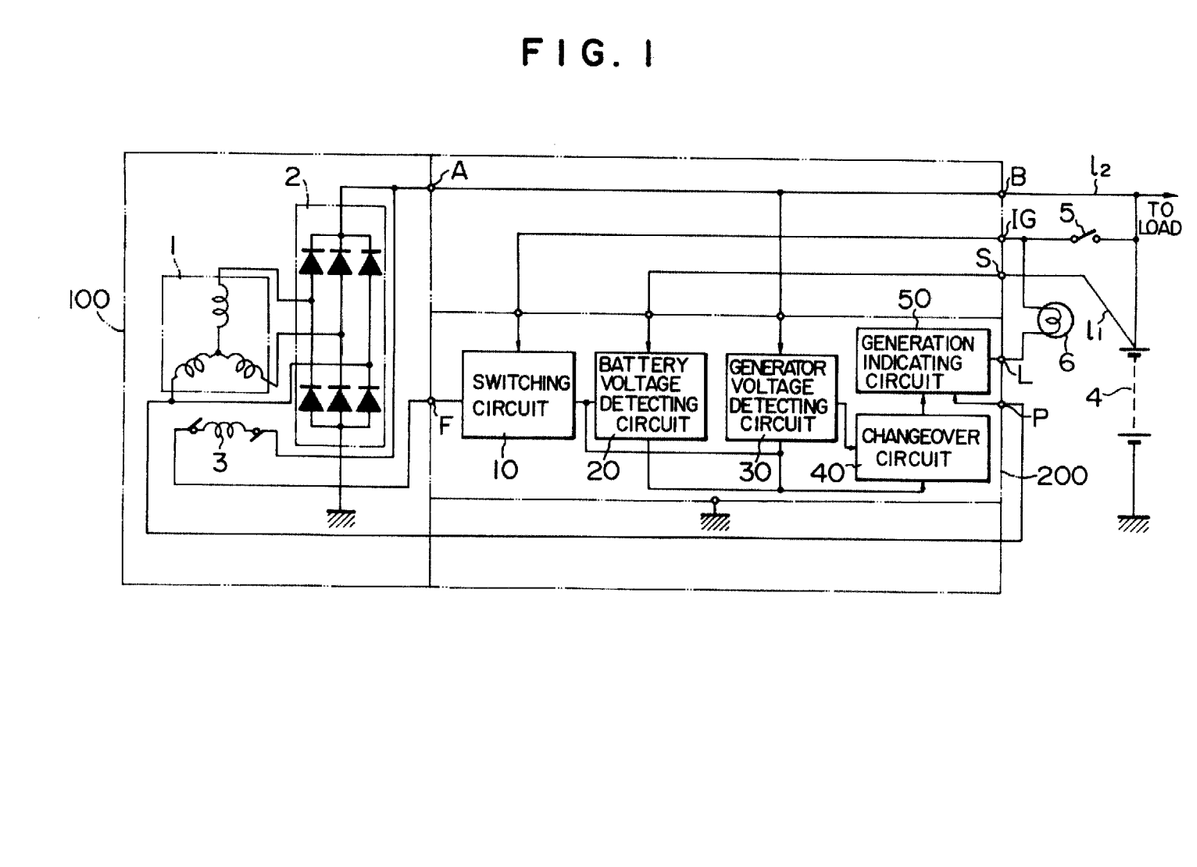
FIG. 1 is a schematic diagram of a vehicle generator embodying a generation control apparatus according to the present invention.

Referring first to FIG. 1, there is illustrated schematically an embodiment of a vehicle generator incorporating the present invention. In the Figure, numeral 100 designates a generator driven from a vehicle engine which is not shown, and the generator 100 generates a DC output obtained by rectifying the three-phase AC voltage produced by the Y connection. Numeral 200 designates a block showing a generation control apparatus according to the invention. In the block 100, numeral 1 designates armature coils, 3 an excitation coil for exciting the generator, and 2 a full-wave rectifier. The block 200 comprises a switching circuit 10 for switching on and off the flow of current in the excitation coil 3, a battery voltage detecting circuit 20 for detecting the battery voltage at a battery side terminal S, a generator voltage detecting circuit 30 for detecting the generated voltage at the generator output terminal, and a changeover circuit 40 for detecting a fault voltage generated by the generator so as to change the voltage detecting terminal from the battery terminal to the generator output terminal and also applying a signal to a generation indicating circuit 50 to turn on a charge indicator lamp 6. The changeover circuit 40 includes a hold circuit for detecting a fault high voltage and continuously generating a detection signal. Numeral 4 designates a vehicle battery, and 5 a vehicle key switch.

Figure 2:
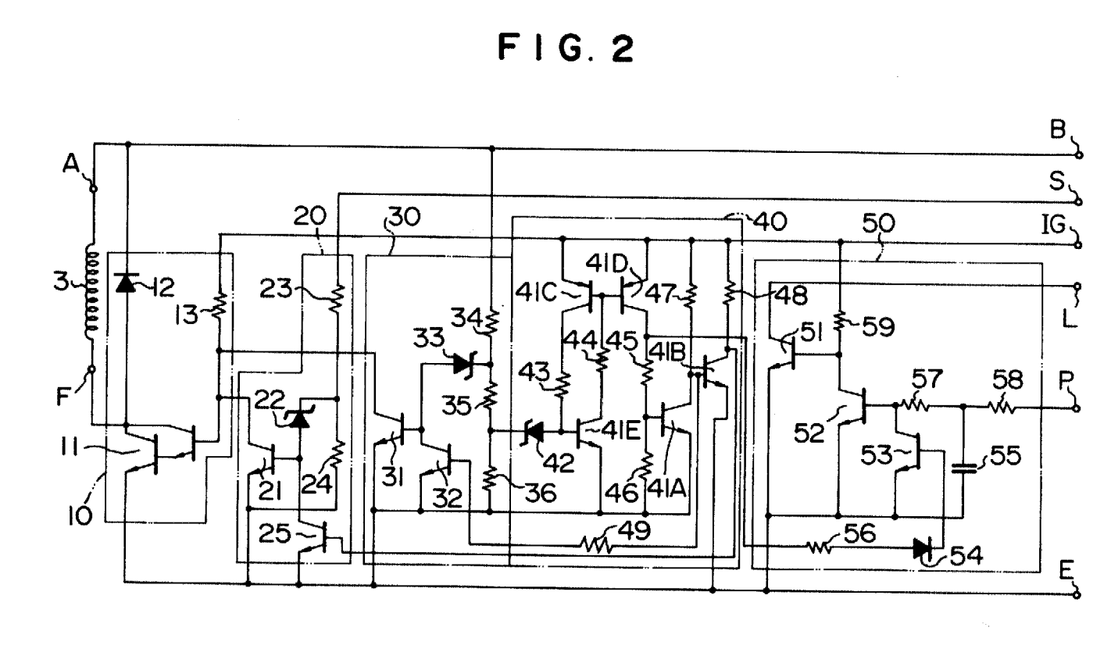
FIG. 2 is a circuit diagram of an embodiment of the generation control apparatus according to the invention.

FIG. 2 shows a specific embodiment of the generation control apparatus 200 which will now be described in detail. The switching circuit 10 comprises Darlington-connected transistors 11, a flywheel diode 12 and a resistor 13, and the excitation coil 3 and the counterelectromotive force absorbing flywheel diode 12 are connected to the collectors of the transistors 11. The other end of the excitation coil 3 is connected to an output terminal A of the rectifier 2 and the other end of the flywheel diode 12 is connected to the input terminal B. Of course, the input terminal B is considered to be equivalent to one which is connected to the output terminal A by a line of the same potential as the output terminal A. The bases of the Darlington-connected transistors 11 are connected through the resistor 13 to an ignition terminal IG connected to the key switch 5.

The battery voltage detecting circuit 20 comprises resistors 23 and 24 for dividing the battery voltage at an input terminal S, a Zener diode 22 for discriminating the divisional voltage so as to be turned on or off and transistors 21 and 25. After the engine has started, the battery voltage detecting circuit 20 operates in the same manner as previously so that the voltage at the input terminal S or the voltage of the battery 4 is regulated at a predetermined value.

The generator voltage detecting circuit 30 comprises resistors 34 to 36 for dividing the voltage at the output terminal B, a Zener diode 33 for discriminating the voltage produced by the resistors 34 to 36 so as to be turned on or off and transistors 31 and 32, and the circuit is responsive to the signal from the changeover circuit 40 so that when any fault condition occurs, the generated voltage of the generator is controlled instead of controlling the battery terminal voltage by the voltage detecting circuit 20.

The changeover circuit 40 comprises a Zener diode 42, transistors 41A to 41E and resistors 43 to 49, whereby the switching between voltage detecting points is effected in accordance with the signals from the transistors 41A and 41B and the switching between operation modes of the generation indicator lamp 6 is effected in accordance with the signal from the transistor 41D.

The generation indicating circuit 50 comprises resistors 56 to 59, a diode 54, a capacitor 55 and transistors 51 to 53. Thus, when a fault voltage is generated, the transistor 53 is turned on through the resistor 56 and the diode 54 so that the transistor 52 is turned off and the transistor 51 is turned on, thereby causing the generation indicator lamp 6 to light.

With the construction described above, the operation of the apparatus according to the invention will now be described. Referring to FIG. 2, when the key switch 5 is closed so that the battery voltage is applied to the ignition terminal IG, the engine starts operating and the generator starts generating power. When the battery terminal voltage or the charged battery voltage eventually exceeds a predetermined voltage, the Zener diode 22 is turned on and the transistor 21 is turned on, thus turning off the Darlington-connected transistors 11 and thereby cutting off the current flow to the excitation coil 3. On the contrary, when the battery voltage becomes lower than the predetermined voltage, the transistors 11 are turned on. In this way, the battery voltage is regulated at the predetermined value.

In this case, the Zener diode 42 is always held off so that the transistors 41A and 41C to 41E of the changeover circuit 40 are turned off and the remaining transistor 41B is turned on. As a result, the transistors 32 and 31 of the generator voltage detecting circuit 30 are respectively forcibly turned on and off and thus no effect is produced even if the Zener diode 33 is turned on and off. On the other hand, since the transistor 41B is turned on cutting off the supply of base current to the transistor 25 of the battery voltage detecting circuit 20, the transistor 25 is turned off and consequently the operation of the transistor 21 is dependent only on the turning on and off of the Zener diode 22.

On the other hand, if a break occurs in the line $l_2$ extending from the generator output terminal B to the battery 4, the battery 4 is no longer charged with the result that the battery terminal voltage decreses and the Zener diode 22 and the transistor 21 are turned off. Thus, the Darlington-connected transistors 11 are always turned on and the full excitation is applied, thereby momentarily generating a high voltage at the generator output terminal A or B. When this occurs, the Zener diode 42 of the changeover circuit 40 is turned on due to the setting so that the transistor 41E is turned on, the transistors 41C and 41D are turned on, the transistor 41A is turned on and the transistor 41B is turned off. The turning on of the transistor 41A turns off the transistor 32 so that the Zener diode 33 and the transistor 31 of the generator voltage detecting circuit 30 are turned on and off the turning on and off of the Darlington-connected transistors 11 are controlled. The turning off of the transistor 41B turns on the transistor 25 so that the transistor 21 is forcibly turned off and the battery voltage detecting circuit 20 for detecting the voltage at the terminal S stops functioning.

On the other hand, the generation indicating circuit 50 is designed so that the in the normal condition the voltage at a generator terminal P turns the transistor 52 on and the transistor 53 off and thus the generation indicator lamp 6 is turned off. When a fault voltage is generated, the changeover circuit 40 comes into operation so that the transistor 53 is operated in response to the supply voltage applied through the transistor 41D and the transistor 53 is turned on. Thus, the transistor 52 is turned off, the transistor 51 is turned on, and the generation indicator lamp 6 is turned on, thus giving a warning to the driver and thereby alterting the driver to the faulty generator voltage.

Also, even if the control is effected in accordance with the generated voltage at the terminal B, the transistor 41C is turned on and the changeover circuit 40 remains in operation causing the lamp 6 to light. Thus the generated voltage at the terminal B is continuously controlled until the key switch 5 is turned off.

Figure 3:
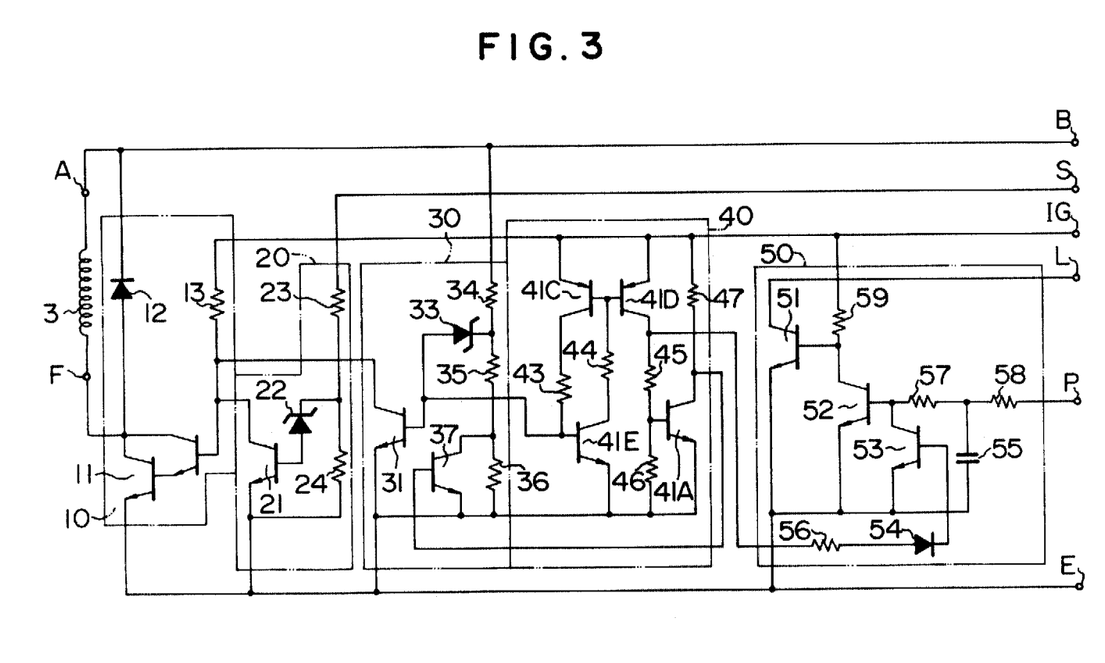
FIG. 3 is a circuit diagram of another embodiment of the generation control apparatus according to the invention.

Referring now to FIG. 3, there is illustrated a second specific embodiment of the generation control apparatus. The basic construction of the second embodiment is the same with the first embodiment shown in FIG. 2. The only difference is that while, in the embodiment of FIG. 2, the changeover circuit 40 includes the fault voltage detecting section comprising the Zener diode 42 as its principal element and particularly the Zener diode 42 is provided in addition to the Zener diode 33 in the generator voltage detecting circuit 30, in the embodiment of FIG. 3 the Zener diode 33 also serves the role of the Zener diode 42. Further, in the embodiment of FIG. 3 the transistors 25 and 41B and the resistors 48 and 49 of FIG. 2 are eliminated and the transistor 32 is replaced by a transistor 37 thus eliminating the means for forcibly stopping the operation of the transistor 21 in the battery voltage detecting circuit 20.

Next, the operation of the principal circuits of FIG. 3 will be described. Firstly, in the normal condition the Zener diode 33 is not turned on so that the transistor 31 of the generator voltage detecting circuit 30 is turned off and the transistors in the changeover circuit 40 are also turned off, thus turning the transistor 37 on. As a result, the input voltage to the Zener diode 33 of the generator voltage detecting circuit 30 has a value obtained by dividing the generated voltage at the terminal B through the resistors 34 and 35. Thus, in response to the operation of the transistor 21 in the battery voltage detecting circuit 20, the Darlington-connected transistors 11 for energizing the excitation coil 3 are turned on and off and the battery terminal voltage is regulated at a predetermined value.

On the other hand, when a fault high voltage is generated due to for example a break in the line $l_2$ leading from the generator to the battery 4, the Zener diode 33 is turned on due to the setting and then the transistors 41E, 41D and 41A are turned on, thus turning the transistor 37 off. As a result, the input voltage applied to the Zener diode 33 has a value obtained by dividing the generated voltage through the resistors 34 to 36. This voltage dividing ratio is greater than that used in the normal condition and consequently the Zener diode 33 is turned on by the generated voltage which is lower than that in the case of the normal condition. Thus, if the value of this turn-on generated voltage is set to be sufficiently lower than the operating voltage of the battery voltage detecting circuit 20 (or the regulated voltage), the battery voltage detecting circuit 20 is not in fact brought into operation. As a result, in the fault condition the Darlington-connected transistors 11 are turned on and off in accordance with the output of the generator voltage detecting circuit 30, thus regulating the generator output terminal voltage at a predetermined value which is lower than the regulated voltage in the normal condition.

While, in the above-described embodiments, the changeover circuit is provided with a holding function by means of the combination of the transistors, this function may be provided by any of various other means such as a flip-flop.

Further, while, in these embodiments, the supply voltage for the excitation coil is applied from the generator output terminal, the exciting voltage may be supplied from the terminal IG.

Further, while these embodiments serve the function of holding the generated fault voltage, the transistor may be eliminated so that the normal power generation is restored as soon as the normal condition is restored.

Further, while, in these embodiments, the generation indicating circuit detects the generation of power by means of the terminal P, it is possible to effect the detection through the terminal N (the generator neutral terminal) and it is also possible to construct the circuit by using relays or the like in place of the transistors.

Figure 4:
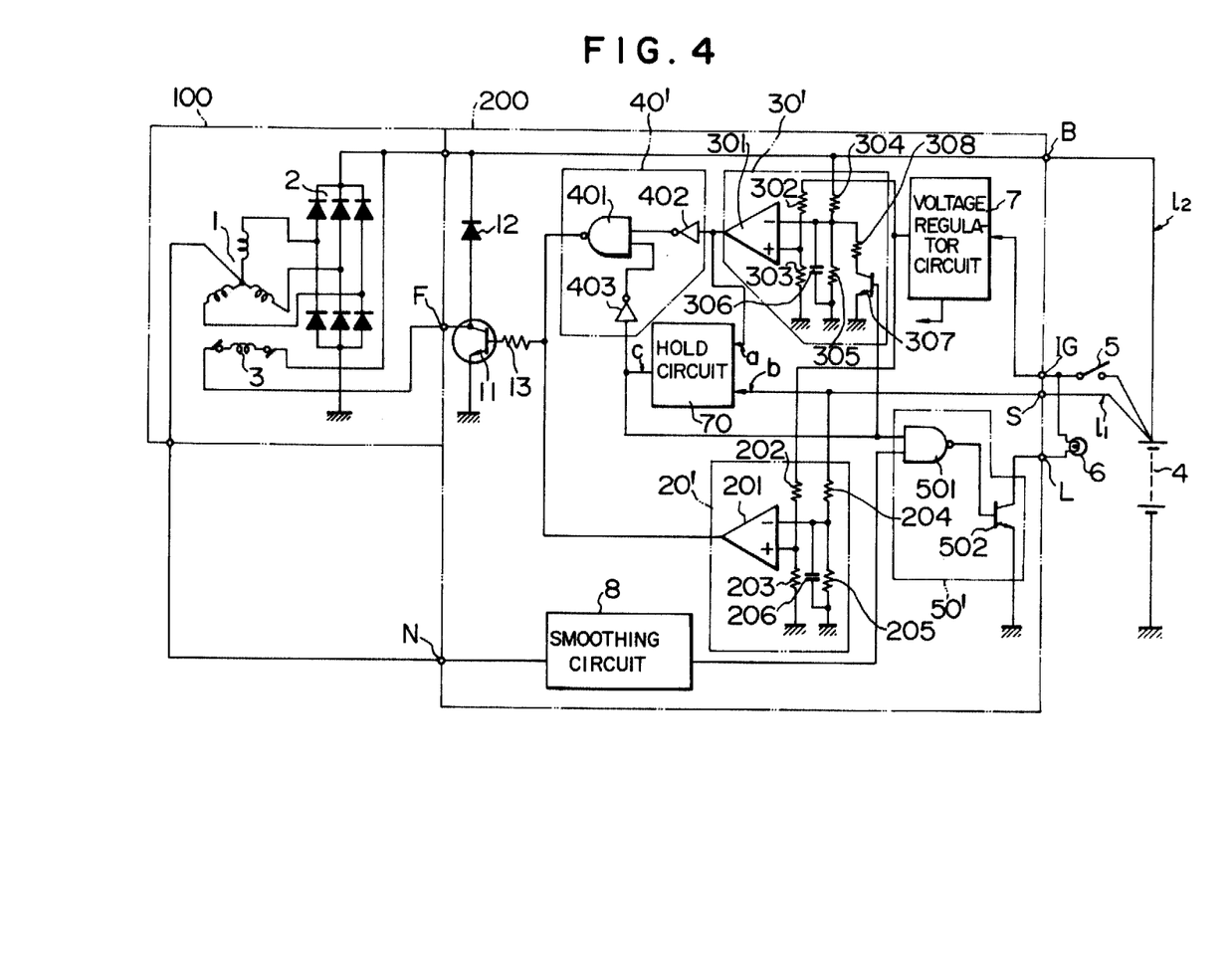
FIG. 4 is a circuit diagram of still another embodiment of the generation control apparatus according to the invention.

Further, while, in these embodiments, each of the circuits is formed by a Zener diode or diode and transistors, it is possible to use a comparator or a logic circuit to form part of each of the circuits as shown in the third embodiment of FIG. 4. This embodiment will now be described mainly with respect to the difference between it and the previously described embodiments. In the Figure, a voltage regulator circuit 7 receives the battery voltage through the key switch 5 to produce and apply a predetermined supply voltage $V_{CC}$ to the respective circuits which will be described later. (The greater part of the voltage supply lines are not shown). A battery voltage detecting circuit 20' for controlling the generation of power in accordance with the battery voltage, comprises a comparator 201, voltage dividing resistors 202 and 203 for generating a reference voltage and voltage dividing resistors 204 and 205 and a smoothing capacitor 206 for supplying a divided battery voltage, whereby the battery voltage and the reference voltage are compared in magnitude and the resulting discrimination signal is generated. A generator voltage detecting circuit 30' for detecting a fault high voltage so as to control the generation of power in accordance with the generated voltage comprises a comparator 301, voltage dividing resistors 302 and 303 for generating a reference voltage, voltage dividing resistors 304 and 305 and a smoothing capacitor 306 for supplying a divided generator output voltage, and a transistor 307 and a voltage dividing resistor 308 for varying the voltage dividing ratio, whereby the generator output voltage and the reference voltage are compared in magnitude and the resulting discrimination signal is generated. A smoothing circuit 8 receives the neutral point voltage as the output voltage of the generator 100 so as to smooth out the voltage and generate a DC level voltage. A generation indicating circuit 50' comprises a NAND gate 501 and an output transistor 502, whereby when the generator is not generating or when a brake occurs in the battery voltage detecting line $l_1$ or the generator output line $l_2$, the transistor 502 is turned on and the lamp 6 is operated. A logical type changeover circuit 40' comprises a NAND gate 401 and inverter gates 402 and 403, whereby only when a break occurs in the battery voltage detecting line $l_1$ of the generator output line $l_2$, the NAND gate 401 is opened and the output transistor 11 is controlled in accordance with the generator output voltage.

A hold circuit 70 monitors the voltage at the battery voltage detecting terminal S and the output voltage so that when at least one of the voltages decreases to a predetermined level, this change is detected and the circuit is triggered so as to generate and hold an output signal until the key switch 5 is opened and its detailed circuit construction will be described later. In this embodiment, immediately after the closing of the key switch 5, the initial setting is effected by the initial setting means of the hold circuit 70 which is not shown and its output C goes to a high level. In the normal condition, the inputs a and b of the hold circuit 70 are at the high level (usually several volts or higher). When one of the inputs a and b goes from the high level to a low level due to for example a break in the output line, the hold circuit 70 is triggered and the output C goes from the high level to the low level.

With the construction described above, the operation of the third embodiment is as follows. When the key switch 5 is closed, the supply voltage is applied to the various circuit through the voltage regulator circuit 7. In this case, if the generator 100 is not generating as yet, the comparator 301 generates a high level signal, and the comparator 201 also generates a high level discrimination signal due to the fact that the battery voltage has decreased to the predetermined value and the voltage at the terminal S has become lower than the reference voltage. At this time, the hold circuit 70 also generates a high level signal due to the initial setting so that the inverter gates 402 and 403 each generates a low level signal and the NAND gate 401 generates a high level signal. Thus, the output transistor 11 is turned on and the generator 100 is excited initially. On the other hand, since the generator 100 is not generating, the output of the smoothing circuit 8 is at the low level so that the NAND gate 501 of the indicating circuit 50' generates a high level signal and the transistor 502 is turned on, thus causing the lamp 6 to light.

Thereafter, when the engine starts operating so that the generator 100 starts generating, the smoothing circuit 8 generates a high level signal and the transistor 502 is turned off, causing the lamp 6 to go off.

On the other hand, when the battery 4 is charged by the output current from the generator 100 so that the battery voltage becomes higher than a predetermined value, the output of the comparator 201 goes from the high level to the low level. Although the inverter gate 403 is generating a low level signal even at this time so that the NAND gate 401 is continuously generating a high level signal, this output current is absorbed by the comparator 201 and the output transistor 11 is turned off, thus cutting off the excitation current. Consequently, the output current of the generator 100 decreases and the battery voltage also decreases. This causes the output of the comparator 20 to go to the high level again so that the output transistor 11 is turned on and the excitation current is switched on again. Thereafter, this process is performed repeatedly so as to regulate the battery voltage at the predetermined value which is dependent on the resistors 202 and 203.

When the generator 100 is generating normally, the generated value is substantially equal to the abovementioned predetermined value and the output C of the hold circuit 70 is at the high level. Thus, the transistor 307 is turned on and the division ratio of the generated voltage is determined by the resistors 304, 305 and 308, holding the input voltage to the comparator 301 at a low value. As a result, the comparator 301 always generates a high level signal.

In this condition, if a break occurs in the battery voltage detecting line $l_1$ due to some cause (such as the disconnection of the terminal S), the third embodiment operates as follows. In this case, the potential at the terminal S goes from the high level to the low level so that this change is detected by the hold circuit 70 and its output C goes from the high level to the low level. Consequently, the NAND gate 501 of the indicating circuit 50' generates a high level signal and the transistor 502 is turned on, thus causing the lamp 6 to light.

On the other hand, the comparator 201 continuously generates a high level signal due to the decrease in the voltage at the terminal S and consequently the battery voltage and the generated voltage are increased. When this occurs, the signal at the input b of the hold circuit 70 goes to the low level and its output C goes to the low level. Thus, the transistor 307 is turned off so that in the circuit 30' the division ratio of the generated voltage is determined by the resistors 304 and 305. The resulting generation control voltage will be referred to as a second predetermined value.

Thus, when the generated voltage exceeds the second predetermined value (the value is generally selected slightly higher than the predetermined value used when the voltage detecting line is not faulty, although the value may be selected substantially equal to the predetermined value used in the normal condition), the output of the comparator 301 goes to the low level so that both the inverter gates 402 and 403 generate high level signals and the output of the NAND gate 401 goes to the low level. As a result, the output current from the comparator 201 is absorbed by the NAND gate 401 and the output transistor 11 is turned off, thus cutting off the excitation current. Thus, the generated voltage decreases and it eventually becomes lower than the second predetermined value, causing the output of the comparator 301 to go to the high level again. As a result, the NAND gate 401 generates a high level signal and the comparator 201 is always generating a high level signal continuously.. Thus, the output transistor 11 is turned on and the excitation current is supplied again. Thereafter, the same process if performed repeatedly so that the generated voltage is regulated at the second predetermined value determined by the resistors 302 and 303 and overcharging of the battery 4 is prevented. In this case, as long as there is the break in the battery voltage detecting line $l_1$, the lamp 6 always lights to alert the driver to the fault condition.

On the other hand, when a break occurs in the generator output line $l_2$ due to some cause (such as the disconnection of the terminal B) instead of a break in the battery voltage detecting line $l_1$, the operation of the third embodiment is as follows. When a break occurs, the fact that the generator output voltage momentarily goes high (generally the voltage becomes over 2 times the normal output voltage) is utilized so that even if the output C of the hold circuit 70 was at the high level until just before this time turning the transistor 307 on and thereby setting the division ratio of the generated voltage sufficiently small, the resulting divisional voltage of the high generator voltage becomes higher than the comparison reference voltage and consequently the output of the comparator 301 momentarily goes from the high level to the low level. As a result, the hold circuit 70 is triggered and its output C goes from the high level to the low level. Thus, the NAND gate 501 of the indicating circuit 50' generates a high level signal and the transistor 502 is turned on, causing the lamp 6 to light. On the other hand, the battery voltage decreases gradually due to the break in the generator output line $l_2$ and it eventually decreases below the predetermined value (e.g., 12 volts). Thus, the comparator 201 continuously generates a high level signal and the generated voltage increases. In this case, the output C of the hold circuit 70 goes to the low level and the transistor 307 is turned off.

Thereafter, when the generated voltage exceeds the second predetermined value, the output of the comparator 301 goes to the low level again so that both the inverter gates 402 and 403 generate high level signals and the output of the NAND gate 401 goes to the low level. As a result, the output current from the comparator 201 is absorbed by the NAND gate 401 and the output transistor 11 is turned off, thus cutting off the excitation current. As a result, the generated voltage decreases and eventually becomes lower than the second predetermined value so that the output of the comparator 301 goes to the high level again and the output transistor 11 is turned on, thus supplying the excitation current again. Thereafter, the same process is performed repeatedly so that the generated voltage is regulated at the second predetermined value and the generated voltage is prevented from increasing abnormally. In this case, the lamp 6 is always turned on.

Figure 5:
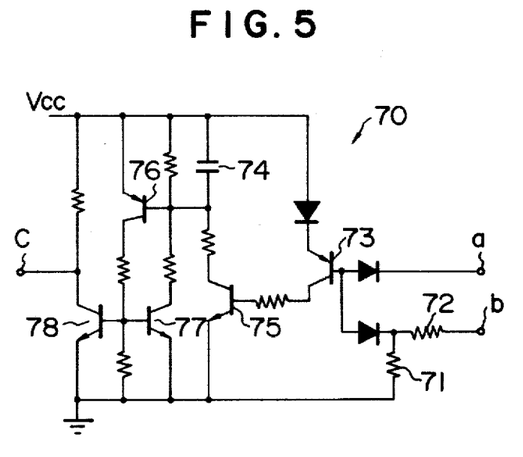
FIG. 5 is a circuit diagram of the hold circuit in FIG. 4.
Figure 6:
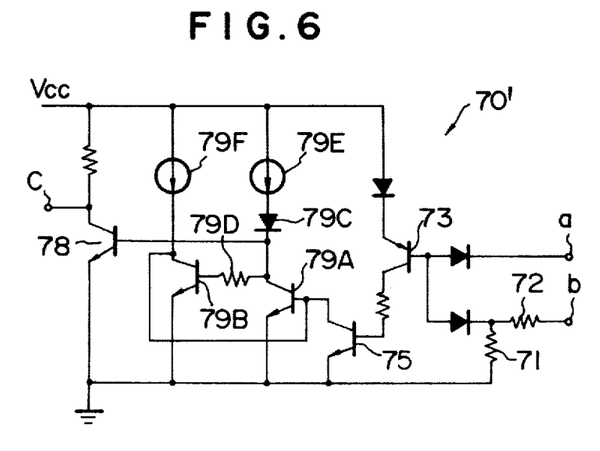
FIG. 6 is a circuit diagram of another example of the hold circuit in FIG. 4.

The hold circuit 70 is shown in block form in the embodiment of FIG. 4, and FIGS. 5 and 6 show its exemplary circuit constructions. In the circuits of FIGS. 5 and 6, the output voltage of circuits of FIGS. 5 and 6, the output voltage of comparator 301 and the battery voltage from the battery voltage detecting terminal S are respectively applied to the inputs a and b and the output C is applied to the inverter 403, the NAND gate 501 and the transistor 307. Designated at $V_{CC}$ is the power supply voltage produced by the voltage regulator circuit 7 shown in FIG. 4. In the circuit of FIG. 5, input resistors 71 and 72 are provided to divide the battery voltage and apply the resulting voltage to a transistor 73. A capacitor 74 forms initial setting means whereby when the power source is connected, a transistor 76 is forcibly turned off and the initial setting of the hold circuit is effected.

Thus, with the circuit of FIG. 5, when the generating system is functioning normally, the inputs a and b go to the high level so that the transistors 73 and 75 to 78 are turned off and the output C goes to the high level. On the contrary, when the generating system becomes faulty so that at least one of the inputs a and b goes to the low level, all the transistors are turned on and thus the output C goes to the low level after which even if the transistor 75 is turned off, the output state is maintained until the power source is disconnected.

In FIG. 6 showing the hold circuit 70 of another type, the function of initial setting means is performed by a diode 79C and a resistor 79D so that when the power source is connected, the base current to a transistor 79B is caused to build up after a delay and thus a transistor 79A is turned on first. Thus, when the generating system is functioning normally, the transistor 79A is turned on and a transistor 78 and the transistor 79B are turned off. On the contrary, when a fault occurs, the transistor 79A is turned off and the transistors 78 and 79B are turned on. Numerals 79E and 79F designate constant current sources.

While, in the above described embodiments, the generator voltage detecting circuits 30 and 30' detect the output voltage of the rectifier 2, in the case of a generator including an auxiliary rectifier, it is possible to arrange so that the generated voltage from the auxiliary rectifier is detected.

Figure 7:
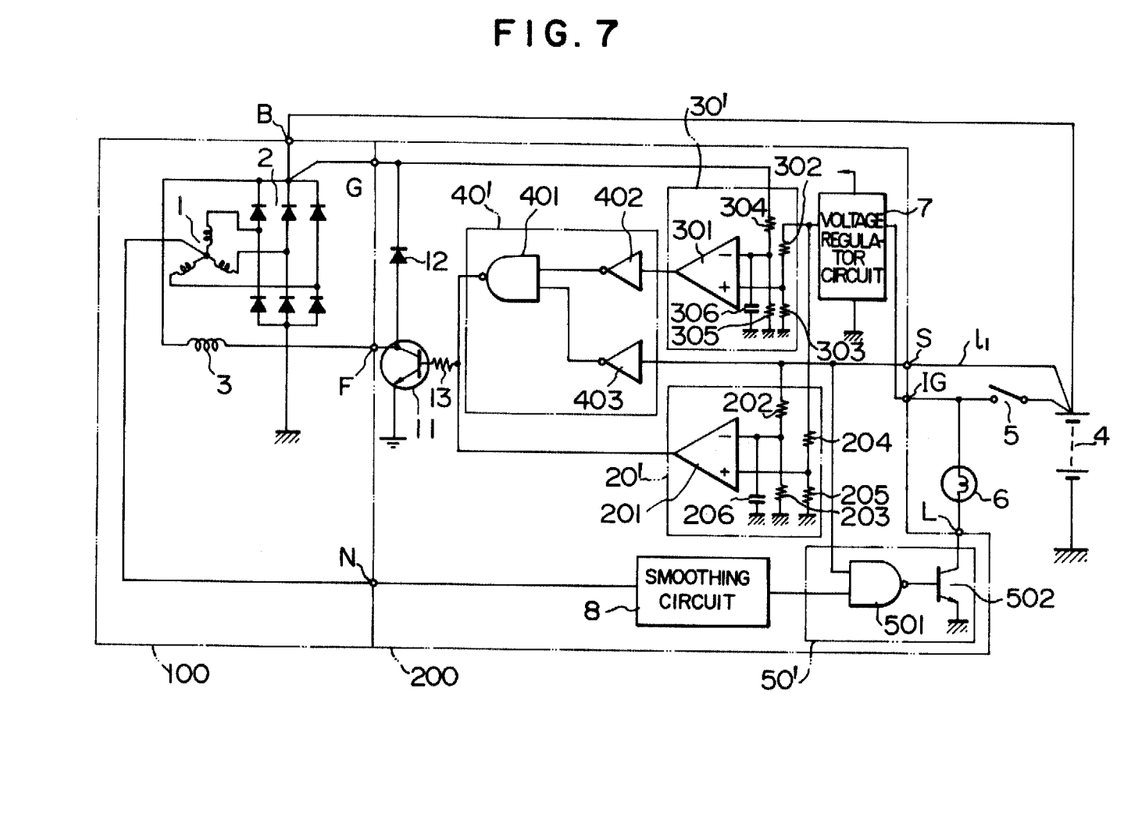
FIG. 7 is a circuit diagram of still another embodiment of the generation control apparatus according to the invention.

Further, with the embodiment shown in FIG. 4, it is possible to eliminate the hold circuit 70, the transistor 307 and the resistor 308 as shown in FIG. 7. In the fourth embodiment shown in FIG. 7, the voltage at the terminal S is applied to the inverter 403 and the NAND gate 501, and the output voltage of the comparator 301 is applied only to the inverter 402.

This embodiment is suitable for use with generating systems of the type which is free from the danger of a break in the charging line $l_2$. In the normal condition as well as in the case of a break in the line $l_1$, this embodiment operates in the same manner as the embodiment of FIG. 4 and will not be described.

We claim:

1. In a generation control apparatus for vehicle generators including a generator having armature coils, an excitation coil and a rectifier for rectifying an AC output from said armature coils, and a battery arranged to be charged by a DC output of said rectifier, the improvement comprising:

a voltage control circuit responsive to the terminal voltage of said battery to control the energization of said generator;

a fault detecting circuit for detecting whether the terminal voltage of said battery or the output voltage of said generator is normal so as to generate a fault detection signal when at least one of said voltages is not normal; and a changeover circuit responsive to said fault detection signal to effect the control of the energization of said generator in accordance with the output voltage of said generator instead of said battery terminal voltage.

2. An apparatus according to claim 1, further comprising a warning circuit for giving a warning when the control of power generation is effected in response to said changeover circuit.

3. An apparatus according to claim 1 wherein said fault detecting circuit includes a generator output voltage detecting circuit comprising;

a voltage divider circuit for producing a divided voltage of the output voltage of said generator, a Zener diode connected to said voltage divider circuit and being applied with the divided voltage, said Zener diode being rendered conductive when said divided voltage exceeds a predetermined level to provide said fault detection signal, and a transistor connected in parallel with a part of said voltage divider circuit for varying the voltage dividing ratio depending on whether said transistor is conductive or non-conductive, and wherein said change over circuit includes a transistor circuit connected to said Zener diode to receive said fault detection signal, said transistor circuit being rendered conductive upon receiving said fault detection signal to provide a signal to said transistor connected in parallel with the part of said voltage divider circuit, said transistor in turn being rendered non-conductive to raise the voltage dividing ratio of said voltage divider circuit whereby said Zener diode being held conductive even when the output voltage of said generator is reduced.

4. An apparatus according to claim 1 wherein said output voltage of said generator is an output voltage of said rectifier.

5. An apparatus according to claim 1 wherein said fault detecting circuit detects a break in an output line between a terminal B connected to said rectifier and said battery, and detects a disconnection of said terminal B to generate said fault detection signal.

6. An apparatus according to claim 5, wherein said changeover circuit controls excitation of said generator in accordance with a voltage of a line between said terminal B and said rectifier when said fault detection signal is generated.

7. An apparatus according to claim 1 wherein said voltage control circuit includes a switching circuit connected to the excitation coil of said generator and a battery voltage detecting circuit connected to said switching circuit, and wherein said fault detecting circuit detects a break in a line between a terminal S connected to said battery voltage detecting circuit and said battery, and detects a disconnection of said terminal S to generate said fault detection signal.

* * * * *